(12) United States Patent
Saito et al.

(10) Patent No.: US 10,269,734 B2
(45) Date of Patent: Apr. 23, 2019

(54) SEMICONDUCTOR ELEMENT

(71) Applicant: ULTRAMEMORY INC., Tokyo (JP)

(72) Inventors: Motoaki Saito, Tokyo (JP); Takao Adachi, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 0 days.

(21) Appl. No.: 15/741,690

(22) PCT Filed: Jul. 16, 2015

(86) PCT No.: PCT/JP2015/070449
§ 371 (c)(1),
(2) Date: Jan. 3, 2018

(87) PCT Pub. No.: WO2017/010010
PCT Pub. Date: Jan. 19, 2017

(65) Prior Publication Data
US 2018/0204811 A1     Jul. 19, 2018

(51) Int. Cl.
*H01L 23/66* (2006.01)
*H01L 21/822* (2006.01)
(Continued)

(52) U.S. Cl.
CPC ........ *H01L 23/66* (2013.01); *H01L 21/76898* (2013.01); *H01L 21/822* (2013.01); *H01L 27/04* (2013.01); *H01L 2223/6627* (2013.01)

(58) Field of Classification Search
None
See application file for complete search history.

(56) References Cited

U.S. PATENT DOCUMENTS 5,095,357 A    3/1992    Andoh et al.
6,187,647 B1   2/2001    Chu
(Continued)

FOREIGN PATENT DOCUMENTS

JP    H03-077360 A    4/1991
JP    2001-176746 A   6/2001
(Continued)

*Primary Examiner* — Benjamin P Sandvik
(74) *Attorney, Agent, or Firm* — Muncy, Geissler, Olds & Lowe, P.C.

(57) ABSTRACT

A semiconductor element that has an element first main surface, an element second main surface that is the reverse surface from the element first main surface, and an element side surface. The semiconductor element is configured from a semiconductor substrate part and an insulating layer part and is provided with: a signal transmission/reception terminal that is provided to the element first main surface and that contacts and can transmit/receive signals to/from an external-substrate signal transmission/reception terminal that is provided to an external substrate that is external to the semiconductor element; and a signal transmission/reception coil that is provided to the element side surface and that, via the element side surface, can transmit/receive signals in a non-contact manner to/from an external-semiconductor-element signal transmission/reception part that is provided to an external semiconductor element that is external to the semiconductor element. The signal transmission/reception coil has: a conductor that is formed inside the insulating layer part; and a conductor that is formed inside the semiconductor substrate part.

9 Claims, 6 Drawing Sheets

(51) Int. Cl.
*H01L 27/04* (2006.01)
*H01L 21/768* (2006.01)

(56) References Cited

U.S. PATENT DOCUMENTS

| | | | |
|---|---|---|---|
| 8,310,025 | B2 | 11/2012 | Nakashiba |
| 8,823,134 | B2 | 9/2014 | Miyagawa et al. |
| 9,847,305 | B2 * | 12/2017 | Kuroda .................. H01L 28/10 |
| 2010/0033022 | A1 | 2/2010 | Saitou |
| 2010/0264515 | A1 | 10/2010 | Nakashiba et al. |
| 2011/0006443 | A1 * | 1/2011 | Noguchi ............... H01L 23/585 |
| | | | 257/786 |
| 2011/0272781 | A1 * | 11/2011 | Tada ..................... H01L 23/645 |
| | | | 257/531 |
| 2013/0037928 | A1 * | 2/2013 | Sasaki ................. H01F 27/2804 |
| | | | 257/691 |
| 2014/0323046 | A1 * | 10/2014 | Asai .................... H01Q 1/2283 |
| | | | 455/41.2 |
| 2018/0033743 | A1 * | 2/2018 | Saito .................... H01L 21/822 |

FOREIGN PATENT DOCUMENTS

| | | |
|---|---|---|
| JP | 2006-066769 A | 3/2006 |
| JP | 2006-216767 A | 8/2006 |
| JP | 2007-180081 A | 7/2007 |
| JP | 2010-041499 A | 2/2010 |
| JP | 2010-109075 A | 5/2010 |
| JP | 2010-251663 A | 11/2010 |
| JP | 2012-054535 A | 3/2012 |
| WO | WO-2009/113372 A1 | 9/2009 |

\* cited by examiner

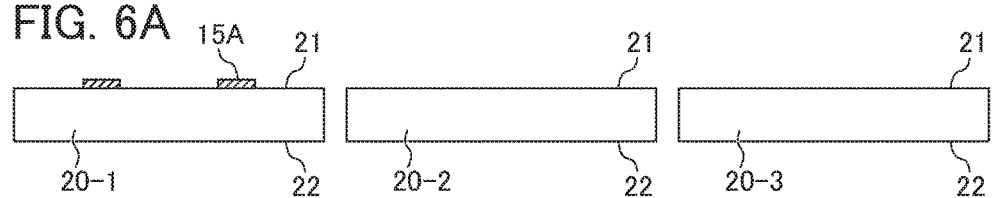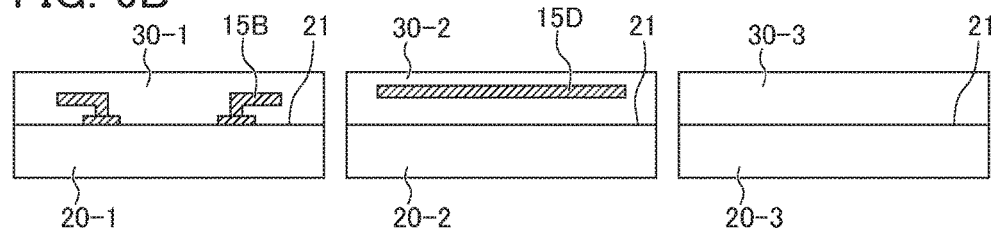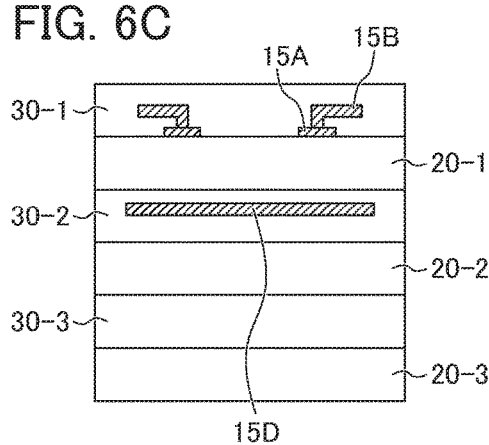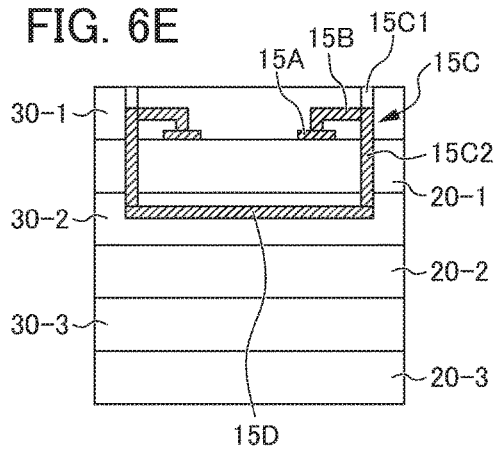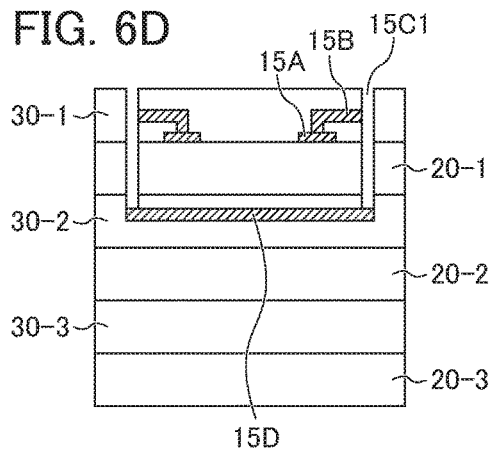

SEMICONDUCTOR ELEMENT

TECHNICAL FIELD

The present invention relates to a semiconductor element capable of transmitting/receiving signals in a non-contact manner.

BACKGROUND ART

Traditionally, a semiconductor device is known which includes a semiconductor element 10 having a coil 302, a semiconductor element 20 having a coil 322, and a silicon interposer 60 having coils 304 and 324 (refer to Patent Document 1). In the semiconductor device in Patent Document 1, a signal is transmitted/received between the coils 302 and 304 in a non-contact manner, and a signal is transmitted/received between the coils 322 and 324 in a non-contact manner. Therefore, the semiconductor elements 10 and 20 can transmit/receive signals via the silicon interposer 60 in a non-contact manner.
Patent Document 1: Japanese Unexamined Patent Application, Publication No. 2010-251663

DISCLOSURE OF THE INVENTION

Problems to be Solved by the Invention

It is desirable for a semiconductor device to have a simple structure. Therefore, it is desirable that signals be directly transmitted/received between two semiconductor elements in a non-contact manner. However, in the semiconductor device in Patent Document 1, the silicon interposer 60 is required when the semiconductor elements 10 and 20 transmit/receive signals to/from each other in a non-contact manner. Therefore, it cannot be said that the semiconductor device according to Patent Document 1 has a simple structure.

A purpose of the present invention is to provide a semiconductor element capable of transmitting/receiving signals with a simple structure in a non-contact manner and a manufacturing method thereof.

Means for Solving the Problems (1) A semiconductor element which has an element first main surface, an element second main surface which is a reverse surface of the element first main surface, and element side surfaces and is configured from a semiconductor substrate part and an insulating layer part, the semiconductor element including: a signal transmission/reception terminal configured to be provided on the element first main surface and transmit/receive signals to/from an external-substrate signal transmission/reception terminal provided on an external substrate that is external to the semiconductor element in a contact manner; and a signal transmission/reception coil configured to be provided on the element side surface and transmit/receive signals to/from an external semiconductor element signal transmission/reception unit which is provided in an external semiconductor element that is external to the semiconductor element via the element side surface in a non-contact manner. The signal transmission/reception coil includes a conductor that is formed inside the insulating layer part and a conductor that is formed inside the semiconductor substrate part.

(2) The signal transmission/reception coil is a solenoid coil, and a helical axis of the solenoid coil extends in a direction passing through the element side surfaces.

(3) The semiconductor substrate part is a semiconductor substrate having a semiconductor substrate first main surface, a semiconductor substrate second main surface which is a reverse surface of the semiconductor substrate first main surface, and semiconductor substrate side surfaces, the insulating layer part is an insulating layer which is arranged on the semiconductor substrate first main surface and has an insulating layer main surface which is a reverse surface of a surface in contact with the semiconductor substrate first main surface, and insulating layer side surfaces, the element first main surface is the insulating layer main surface, the element second main surface is the semiconductor substrate second main surface, and the element side surface is formed by the semiconductor substrate side surface and the insulating layer side surface, and the signal transmission/reception coil may include a pair of coil forming conductors formed inside the insulating layer, a pair of coil forming through conductors passing through the semiconductor substrate and connected to the pair of coil forming conductors, and a coil forming bridge conductor which is formed on the element second main surface and forms a connection between the pair of coil forming through conductors.

(4) The semiconductor substrate part is a plurality of semiconductor substrates including a semiconductor substrate first main surface, a semiconductor substrate second main surface which is the reverse surface of the semiconductor substrate first main surface, and semiconductor substrate side surfaces, the insulating layer part is a plurality of insulating layers each of which is arranged on the semiconductor substrate first main surface of each of the plurality of semiconductor substrates and has an insulating layer main surface which is the reverse surface of the semiconductor substrate first main surface, and insulating layer side surfaces, the plurality of semiconductor substrates and the plurality of insulating layers are alternately arranged, the element first main surface is the insulating layer main surface of the closest of the plurality of insulating layers to the element first main surface, the element second main surface is the semiconductor substrate second main surface of the closest of the plurality of semiconductor substrates to the element second main surface, and each of the element side surfaces is formed by the semiconductor substrate side surfaces of the plurality of semiconductor substrates and the insulating layer side surfaces of the plurality of insulating layers, and the signal transmission/reception coil may include a pair of coil forming conductors formed inside an insulating layer on the first main surface which is one of the plurality of insulating layers, a coil forming bridge conductor that is formed inside an insulating layer on the second main surface which is one of the plurality of insulating layers and is arranged closer to the element second main surface than the insulating layer on the first main surface, and a pair of coil forming through conductors which forms a connection between the pair of coil forming conductors and the coil forming bridge conductor.

(5) The semiconductor substrate part is a plurality of semiconductor substrates including a semiconductor substrate first main surface, a semiconductor substrate second main surface which is the reverse surface of the semiconductor substrate first main surface, and semiconductor substrate side surfaces, the insulating layer part is a plurality of insulating layers each of which is arranged on the semiconductor substrate first main surface of each of the plurality of semiconductor substrates and has an insulating layer main surface which is the reverse surface of the semiconductor substrate first main surface, and insulating layer side surfaces, the plurality of semiconductor substrates and the plurality of insulating layers are alternately arranged, the element first main surface is the insulating layer main surface of the closest of the plurality of insulating layers to the element first main surface, the element second main surface is the semiconductor substrate second main surface of the closest of the plurality of semiconductor substrates to the element second main surface, and each of the element side surfaces is formed by the semiconductor substrate side surfaces of the plurality of semiconductor substrates and the insulating layer side surfaces of the plurality of insulating layers, and the signal transmission/reception coil may include a pair of coil forming conductors formed inside one of the plurality of insulating layers, a coil forming bridge conductor arranged on the element second main surface, and a pair of coil forming through conductors which forms a connection between the pair of coil forming conductors and the coil forming bridge conductor.

(6) The present invention relates to a method of manufacturing the semiconductor element according to (3), including: a process of preparing the semiconductor substrate having the semiconductor substrate first main surface, the semiconductor substrate second main surface, and the semiconductor substrate side surfaces; an insulating layer laminating process of laminating the insulating layer onto the semiconductor substrate first main surface and including a process of forming the pair of coil forming conductors in the insulating layer; a through-hole forming process of forming a through-hole in the semiconductor substrate and a part of the insulating layer so that the pair of coil forming conductors is exposed from the semiconductor substrate second main surface; a through conductor forming process of forming the pair of coil forming through conductors by disposing a conductive material in the through-hole; and a bridge conductor forming process of forming the coil forming bridge conductor on the semiconductor substrate second main surface so as to connect the pair of coil forming through conductors.

(7) The present invention relates to a method of manufacturing the semiconductor element according to (4), including: an insulating layer laminating process of forming the plurality of semiconductor substrates, on which the insulating layer is formed, by laminating the insulating layer onto each of the plurality of semiconductor substrates and including a process of forming the coil forming conductors in the insulating layer on the first main surface and a process of forming the coil forming bridge conductor, which is not connected to the other conductor, in the insulating layer on the second main surface; a process of alternately arranging the plurality of semiconductor substrates and the plurality of insulating layers by bonding the plurality of semiconductor substrates onto which the insulating layer has been laminated; a through-hole forming process of forming a through-hole from the element first main surface and forming the through-hole so that the coil forming bridge conductor and the pair of coil forming conductors are exposed; and a through conductor forming process of forming the pair of coil forming through conductors and the coil forming conductor by disposing a conductive material in the through-hole and connecting the pair of coil forming through conductors by the coil forming bridge conductor.

(8) The present invention is a method of manufacturing the semiconductor element according to (5), including: an insulating layer laminating process of forming the plurality of semiconductor substrates, on which the insulating layer is formed, by laminating the insulating layer on each of the plurality of semiconductor substrates and including a process of forming the coil forming conductor in one of the insulating layers; a process of alternately arranging the plurality of semiconductor substrates and the plurality of insulating layers by bonding the plurality of semiconductor substrates onto which the insulating layer has been laminated; a through-hole forming process of forming a through-hole from the element second main surface and forming the through-hole so that the pair of coil forming conductors is exposed; a through conductor forming process of forming the pair of coil forming through conductors by disposing a conductive material in the through-hole; and a process of forming the coil forming bridge conductor, for connecting the pair of coil forming through conductors, on the semiconductor substrate second main surface.

Effects of the Invention

According to the present invention, a semiconductor element capable of transmitting/receiving signals with a simple structure in a non-contact manner and a manufacturing method thereof can be provided.

BRIEF DESCRIPTION OF THE DRAWINGS

FIG. 6A is a diagram describing a method of manufacturing the signal transmission/reception coil of the semiconductor element according to the second embodiment of the present invention. FIG. 6B is a diagram describing the method of manufacturing the signal transmission/reception coil of the semiconductor element according to the second embodiment of the present invention. FIG. 6C is a diagram describing the method of manufacturing the signal transmission/reception coil of the semiconductor element according to the second embodiment of the present invention. FIG. 6D is a diagram describing the method of manufacturing the signal transmission/reception coil of the semiconductor element according to the second embodiment of the present invention. FIG. 6E is a diagram describing the method of manufacturing the signal transmission/reception coil of the semiconductor element according to the second embodiment of the present invention.

PREFERRED MODE FOR CARRYING OUT THE INVENTION

First Embodiment

Figure 1A:
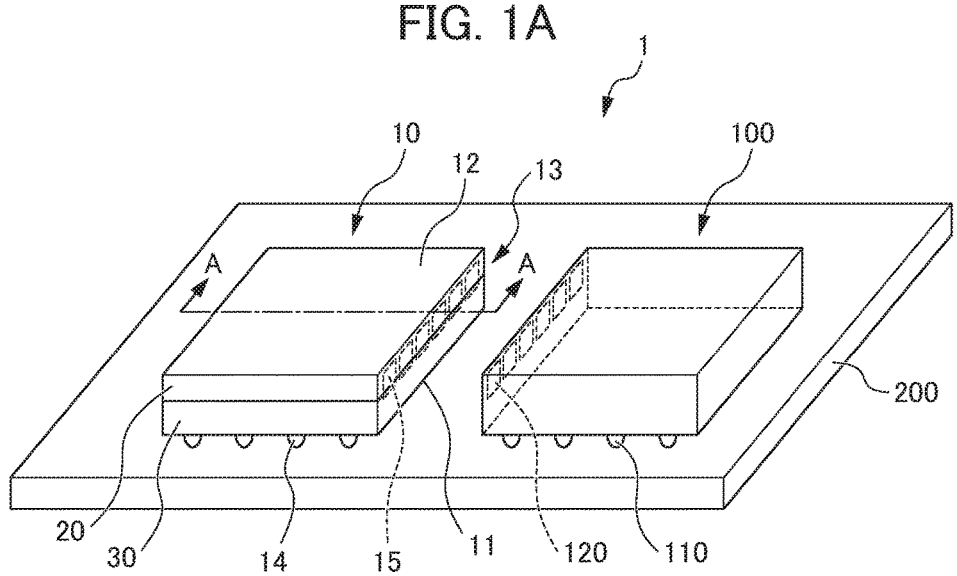
FIG. 1A is a perspective view describing a semiconductor element according to a first embodiment of the present invention.
Figure 1B:
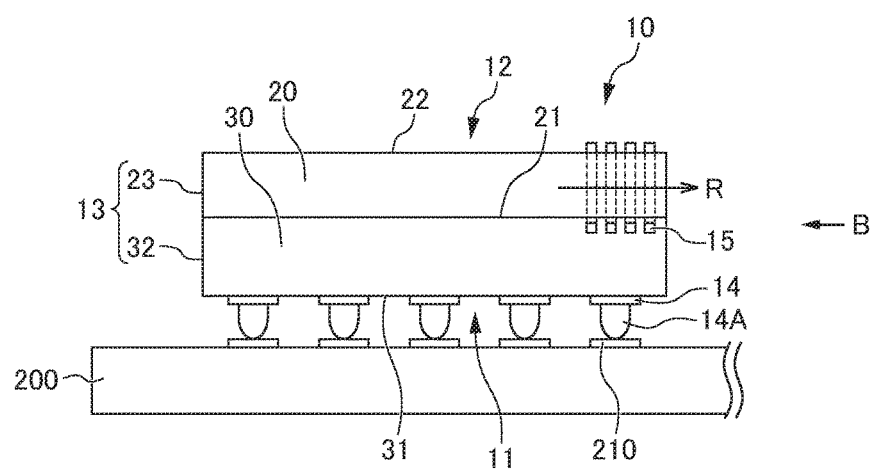
FIG. 1B is a sectional view taken along a line A-A of the semiconductor element describing the semiconductor element according to the first embodiment of the present invention.
Figure 2:
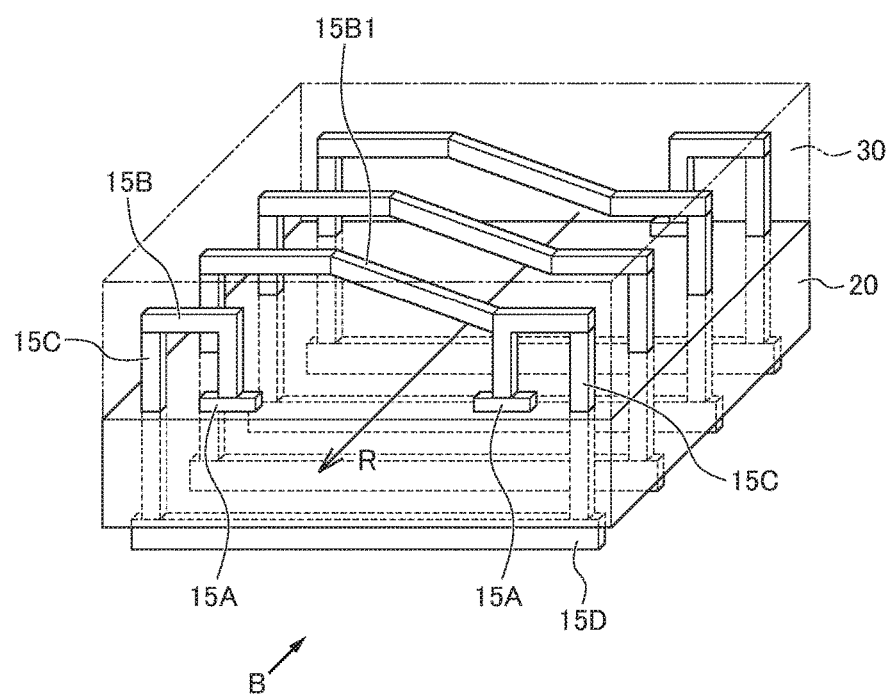
FIG. 2 is a perspective view of a signal transmission/reception coil viewed from an element side surface (viewed from direction B).

The embodiments of the present invention are described with reference to the drawings below. FIG. 1A is a perspective view describing a semiconductor element according to a first embodiment of the present invention, and FIG. 1B is a sectional view taken along a line A-A of the semiconductor element. FIG. 2 is a perspective view of a signal transmission/reception coil viewed from an element side surface (viewed from direction B).

In the following description, "to transmit/receive signals in a non-contact manner" means that one transmission/reception unit for transmitting/receiving signals and the other transmission/reception unit for transmitting/receiving signals transmit/receive signals to/from each other in a non-contact manner and without via a conductive member (one or more of solder, conductive adhesive, wire, or the like). Furthermore, "to contact and transmit/receive signals" means that one transmission/reception unit for transmitting/receiving signals and the other transmission/reception unit for transmitting/receiving signals contact and transmit/receive signals to/from each other or via the conductive member (one or more of solder, conductive adhesive, wire, or the like). Transmission/reception is a concept including to transmit and to receive, only to transmit, and only to receive. Therefore, the transmission/reception unit and a transmission/reception terminal include not only a unit for transmitting and receiving signals but also a unit only for transmitting signals, and a unit only for receiving signals.

As illustrated in FIGS. 1A and 1B, a semiconductor device 1 includes a semiconductor element 10, an external semiconductor element 100, and an external substrate 200. The semiconductor device 1 is mounted on a circuit board (not shown) provided in an electronic device or the like to exert a predetermined function in the electronic device or the like.

The semiconductor element 10 is a semiconductor element according to the first embodiment. The semiconductor element 10 has a rectangular parallelepiped shape. The semiconductor element 10 has an element first main surface 11, an element second main surface 12, element side surfaces 13, signal transmission/reception terminals 14, and signal transmission/reception coils 15 as signal transmission/reception units.

The semiconductor element 10 includes a semiconductor substrate 20 as a semiconductor substrate part and an insulating layer 30 as an insulating layer part. The semiconductor substrate 20 has a semiconductor substrate first main surface 21, a semiconductor substrate second main surface 22, and semiconductor substrate side surfaces 23. The insulating layer 30 has an insulating layer main surface 31 and insulating layer side surfaces 32.

The element first main surface 11 faces the external substrate 200 and is parallel to the surface of the external substrate 200. The element second main surface 12 is a reverse surface of the element first main surface 11. The element side surface 13 is perpendicular to the element first main surface 11 and the element second main surface 12. Four element side surfaces 13 are provided.

The semiconductor substrate 20 is made of silicon. The semiconductor substrate first main surface 21 is parallel to the surface of the external substrate 200. The semiconductor substrate second main surface 22 is a reverse surface of the semiconductor substrate first main surface 21. The semiconductor substrate side surface 23 is perpendicular to the semiconductor substrate first main surface 21 and the semiconductor substrate second main surface 22. Four semiconductor substrate side surfaces 23 are provided.

The insulating layer 30 is made of silicon oxide and is arranged on the semiconductor substrate first main surface 21. The insulating layer main surface 31 faces the surface of the external substrate 200 and is parallel to the surface of the external substrate 200. The insulating layer side surface 32 is perpendicular to the insulating layer main surface 31. As described later, the insulating layer 30 is formed of a plurality of insulating films.

As illustrated in FIG. 1B, the element first main surface 11 is formed of the insulating layer main surface 31. The element second main surface 12 is formed by the semiconductor substrate second main surface 22. The element side surface 13 is formed by the semiconductor substrate side surface 23 and the insulating layer side surface 32. The semiconductor substrate side surface 23 is connected to the insulating layer side surface 32 without a step.

The signal transmission/reception terminal 14 is arranged on the element first main surface 11 (insulating layer main surface 31). A plurality of signal transmission/reception terminals 14 is arranged. Each signal transmission/reception terminal 14 is connected to a signal processing unit or the like (not shown) formed on the semiconductor substrate first main surface of the semiconductor substrate 20 via wiring (not shown) formed inside the insulating layer 30.

The signal transmission/reception coil 15 is provided on the element side surface 13. More specifically, the signal transmission/reception coil 15 is provided on the element side surface 13 formed by the semiconductor substrate side surface 23 and the insulating layer side surface 32. Six (plurality of) signal transmission/reception coils 15 are provided in line. The signal transmission/reception coil 15 includes a conductor that is formed inside the insulating layer 30 and a conductor that is formed inside the semiconductor substrate 20.

The signal transmission/reception coil 15 is a solenoid coil (cylindrical coil formed by winding conductive wire in a spiral shape) and can generate a magnetic field toward the element side surface 13 formed by the semiconductor substrate side surface 23 and the insulating layer side surface 32. The signal transmission/reception coil 15 can generate an induced current by receiving a magnetic field from outside the semiconductor element 10 toward the element side surface 13 formed by the semiconductor substrate side surface 23 and the insulating layer side surface 32. The magnetic fields are substantially perpendicular to the insulating layer side surface 32 and are substantially parallel to the element first main surface 11 and the element second main surface 12. A specific shape of the signal transmission/reception coil 15 is described below with reference to FIG. 2.

"The signal transmission/reception coil 15 is provided on the semiconductor substrate side surface 23 and the insulating layer side surface 32 (or element side surface 13)" indicates a concept including both a state where the signal transmission/reception coil 15 exists near the semiconductor substrate side surface 23 and the insulating layer side surface 32 (or element side surface 13) and is not exposed from the semiconductor substrate side surface 23 and the insulating layer side surface 32 (or element side surface 13) and a state where the signal transmission/reception coil 15 exists near the semiconductor substrate side surface 23 and the insulating layer side surface 32 (or element side surface 13) and is exposed on the insulating layer side surface 32 (or element side surface 13). It is preferable that the signal transmission/reception coil 15 exist near the semiconductor substrate side surface 23 and the insulating layer side surface 32 (or element side surface 13) so that the signal transmission/reception coil 15 can generate a magnetic field sufficient to transmit/receive signals via the insulating layer side surface 32 and can generate the induced current by receiving the magnetic field from outside the semiconductor element 10 toward the insulating layer side surface 32.

The external semiconductor element 100 includes external semiconductor element signal transmission/reception terminals 110 and external semiconductor element signal transmission/reception coils 120 as external signal transmission/reception units. The external substrate 200 includes external-substrate signal transmission/reception terminals 210.

The semiconductor element 10 is mounted on the external substrate 200. Specifically, an electrical connection between each signal transmission/reception terminal 14 and each external-substrate signal transmission/reception terminal 210 via a conductive member 14A makes the semiconductor element 10 mounted on the external substrate 200. The conductive member 14A is a conductive member such as solder and conductive adhesive. Therefore, it can be said that the signal transmission/reception terminal 14 and the external-substrate signal transmission/reception terminal 210 contact and can transmit/receive signals to/from each other.

Similarly to the semiconductor element 10, the external semiconductor element signal transmission/reception terminal 110 is connected to the external-substrate signal transmission/reception terminal 210 via a conductive member (not shown) so that the external semiconductor element 100 is mounted on the external substrate 200. Therefore, it can be said that the external semiconductor element signal transmission/reception terminal 110 and the external-substrate signal transmission/reception terminal 210 contact and can transmit/receive signals to/from each other.

Similarly to the semiconductor element 10, the external semiconductor element signal transmission/reception coil 120 is provided on a side surface of the external semiconductor element 100. The semiconductor element 10 and the external semiconductor element 100 are mounted on the external substrate 200 in a state where the signal transmission/reception coil 15 faces the external semiconductor element signal transmission/reception coil 120.

The signal transmission/reception coil 15 can transmit/receive signals to/from the external semiconductor element signal transmission/reception coil 120 via the element side surface 13 (semiconductor substrate side surface 23 and insulating layer side surface 32) in a non-contact manner. That is, the signal transmission/reception coil 15 and the external semiconductor element signal transmission/reception coil 120 can transmit/receive signals in a non-contact manner via the element side surface 13 (semiconductor substrate side surface 23 and insulating layer side surface 32) by inductive coupling generated between both coils.

As illustrated in FIG. 2, the signal transmission/reception coil 15 is a solenoid coil (cylindrical coil formed by winding conductive wire in a spiral shape). A helical axis R of the solenoid coil extends in a direction passing through the element side surfaces 13. The helical axis R of the solenoid coil is substantially perpendicular to the element side surface 13 and is substantially parallel to the element first main surface 11 and the element second main surface 12. The number of turns of the signal transmission/reception coil 15 is four (more than one). In FIG. 2, the signal transmission/reception coil 15 has a rectangular cylindrical shape formed by winding a conductive wire in a spiral shape. However, the signal transmission/reception coil 15 may be a cylindrical coil formed by winding a conductive wire in a spiral shape, an oblong cylindrical coil formed by winding a conductive wire in a spiral shape, or the like.

The signal transmission/reception coil 15 includes four pairs of coil forming conductors 15B, three coil forming conductor connecting conductors 15B1, four pairs of coil forming through conductors 15C, and four coil forming bridge conductors 15D. The four pairs of coil forming conductors 15B are conductors (for example, copper or aluminum) formed inside the insulating layer. The three coil forming conductor connecting conductors 15B1 are conductors (for example, copper or aluminum) which connect between the coil forming conductors 15B and are formed inside the insulating layer. Each of the three coil forming conductor connecting conductors 15B1 has a bent part. The four pairs of coil forming through conductors 15C are through electrodes (TSV) for passing through the semiconductor substrate 20 and a part of the insulating layer 30. The conductor of the four pairs of the coil forming through conductors 15C is, for example, copper, polysilicon, or tungsten. The four coil forming bridge conductors 15D are arranged on the semiconductor substrate second main surface 22. The conductor of the four coil forming bridge conductor 15D is aluminum, polysilicon, or the like.

The size of the signal transmission/reception coil 15 is 7*10 $\mu m^2$. The interval between each of the six signal transmission/reception coils 15 is 15 $\mu m$.

As described above, the helical axis R of the signal transmission/reception coil 15 which is a solenoid coil extends in a direction passing through the element side surfaces 13, and the helical axis R of the solenoid coil is substantially perpendicular to the insulating layer side surfaces 32 and is substantially parallel to the element first main surface 11 and the element second main surface 12. Therefore, the signal transmission/reception coil 15 can generate a magnetic field which is substantially perpendicular to the element side surfaces 13 and is substantially parallel to the element first main surface 11 and the element second main surface 12. Furthermore, the signal transmission/reception coil 15 can generate an induced current by receiving the magnetic field which is substantially perpendicular to the element side surface 13 and is substantially parallel to the element first main surface 11 and the element second main surface 12.

Next, a method of manufacturing the signal transmission/reception coil 15 of the semiconductor element 10 is described with reference to FIGS. 3A to 3E. FIGS. 3A to 3E are diagrams describing the method of manufacturing the signal transmission/reception coil of the semiconductor element according to the first embodiment of the present invention. As described above, the signal transmission/reception coil 15 is a solenoid coil of which the number of turns is four. However, for convenience of description regarding the manufacturing method, a first turn (for example, the part closest to the element side surface 13) is illustrated in FIGS. 3A to 3E. The manufacturing methods of second and third turns are similar to that of the first turn, and the second to fourth turns are manufactured similarly to the first turn.

Figure 3A:
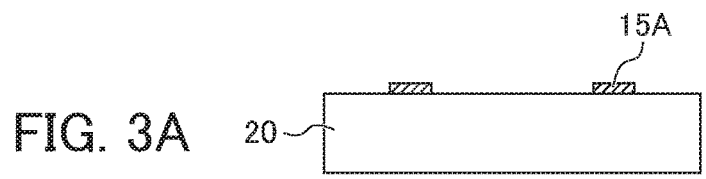
FIG. 3A is a diagram describing a method of manufacturing the signal transmission/reception coil of the semiconductor element according to the first embodiment of the present invention.

As illustrated in FIG. 3A, the semiconductor substrate 20 having the semiconductor substrate first main surface 21 on which a pair of conductors on the semiconductor substrate 15A is formed is prepared.

Figure 3B:
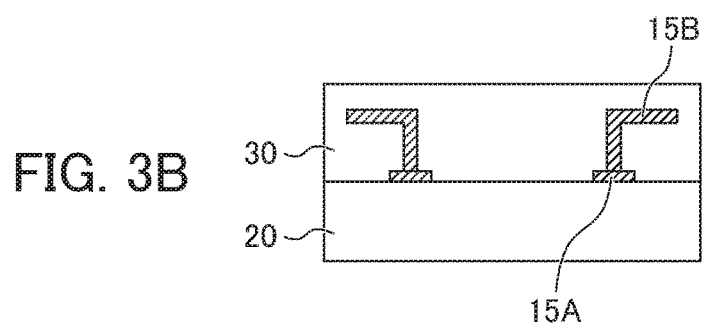
FIG. 3B is a diagram describing the method of manufacturing the signal transmission/reception coil of the semiconductor element according to the first embodiment of the present invention.

As illustrated in FIG. 3B, the insulating layer 30 is formed on the semiconductor substrate first main surface 21 of the semiconductor substrate 20. The pair of coil forming conductors 15B is formed in the process of forming the insulating layer 30. The pair of coil forming conductors 15B is manufactured by using the known Damascene method. Therefore, here, a detailed description of the manufacturing method is omitted. The insulating layer 30 manufactured by using the known Damascene method is formed of a plurality of insulating films. The pair of coil forming conductors 15B is formed of copper. It is possible to dispose a barrier metal (Ti, TiN, or the like, not shown), to enhance adhesion, between the insulating layer 30 and the pair of coil forming conductors 15B. Although not shown, in addition to the above, the coil forming conductor connecting conductor 15B1 is formed.

Figure 3C:
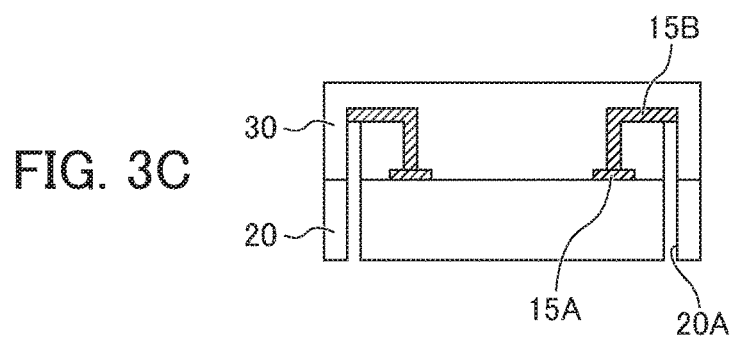
FIG. 3C is a diagram describing the method of manufacturing the signal transmission/reception coil of the semiconductor element according to the first embodiment of the present invention.

As illustrated in FIG. 3C, the semiconductor substrate 20 and a part of the insulating layer 30 are selectively removed by etching or the like until the pair of coil forming conductors 15B is exposed from the semiconductor substrate second main surface 22 of the semiconductor substrate 20. As a result, a coil forming through-hole 15C1 is formed.

Figure 3D:
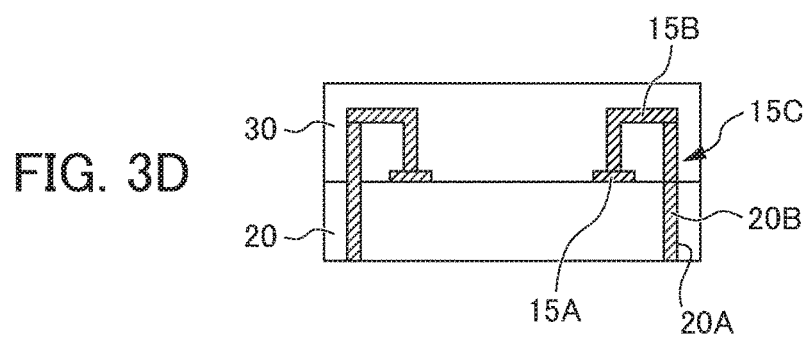
FIG. 3D is a diagram describing the method of manufacturing the signal transmission/reception coil of the semiconductor element according to the first embodiment of the present invention.

Next, a conductive material 15C2 is formed inside the coil forming through-hole 15C1. More specifically, the forming method is as follows. The conductive material 15C2 is formed inside the coil forming through-hole 15C1 and on the semiconductor substrate second main surface 22 by electroplating or the like. Then, the conductive material 15C2 that is external to the coil forming through-hole 15C1 is removed by chemical mechanical polishing (CMP) or the like. As a result, as illustrated in FIG. 3D, the pair of coil forming through conductors 15C respectively connected to the pair of coil forming conductors 15B is formed. It is possible to dispose the barrier metal (Ti, TiN, or the like, not shown), to enhance adhesion to the semiconductor substrate 20 and the insulating layer 30, before the conductive material 15C2 is formed.

Figure 3E:
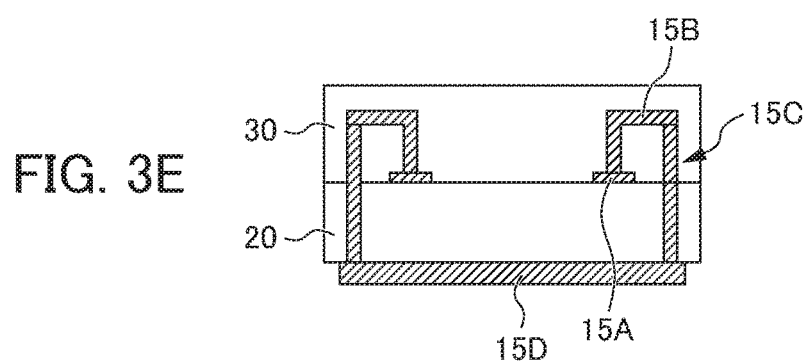
FIG. 3E is a diagram describing the method of manufacturing the signal transmission/reception coil of the semiconductor element according to the first embodiment of the present invention.

Subsequently, as illustrated in FIG. 3E, the coil forming bridge conductor 15D is formed on the semiconductor substrate second main surface 22 so as to be connected to the pair of coil forming through conductors 15C. The coil forming bridge conductor 15D may be formed by, for example, sputtering and etching. The coil forming bridge conductor 15D is formed of aluminum, polysilicon, or the like.

In the method of manufacturing the semiconductor element 10 according to the first embodiment, the process illustrated in FIG. 3B is an insulating layer laminating process in which the insulating layers are laminated. The insulating layer laminating process includes a process of forming the pair of coil forming conductors 15B. The process illustrated in FIG. 3C is a through-hole forming process. The process illustrated in FIG. 3D is a through conductor forming process. The process illustrated in FIG. 3E is a bridge conductor forming process.

The signal transmission/reception coil 15 is manufactured according to the processes described above. The pair of coil forming conductors 15B is manufactured by using the known Damascene method which is used when a wire is formed inside the insulating layer of the semiconductor element. Therefore, the pair of coil forming conductor 15B is concurrently formed when a signal line or the like (not shown) of the semiconductor element 10 is formed.

The semiconductor element 10 according to the first embodiment having the above structure provides the following effects. The semiconductor element 10 has the element first main surface 11, the element second main surface 12 that is the reverse surface of the element first main surface 11, and the element side surface 13 and is configured from the semiconductor substrate part (semiconductor substrate 20) and the insulating layer part (insulating layer 30). The semiconductor element 10 includes the signal transmission/reception terminal 14 which is provided on the element first main surface 11 and can respectively transmit/receive signals to/from the external-substrate signal transmission/reception terminals 210 provided on the external substrate 200 that is external to the semiconductor element 10 in a contact manner and the signal transmission/reception coil 15 which is provided on the element side surface 13 and can transmit or receive signals to/from the external semiconductor element signal transmission/reception coil 120 provided in the external semiconductor element 100 that is external to the semiconductor element 10 via the element side surface 13 in a non-contact manner. The signal transmission/reception coil 15 includes the conductors formed inside the insulating layer 30 (coil forming conductor 15B) and the conductors formed inside the semiconductor substrate 20 (coil forming through conductor 15C).

The signal transmission/reception coil 15 is a solenoid coil, and the helical axis of the solenoid coil extends in the direction passing through the element side surface 13. In addition, in the insulating layer 30, the signal transmission/reception coil 15 includes the pair of coil forming conductors which extends from the semiconductor substrate first main surface toward the insulating layer main surface and the coil forming bridge conductor which forms a connection between the pair of the coil forming conductors. In the semiconductor element 10, the semiconductor substrate part is the semiconductor substrate 20 having the semiconductor substrate first main surface 21, the semiconductor substrate second main surface 22 that is the reverse surface of the semiconductor substrate first main surface 21, and the semiconductor substrate side surfaces 23, and the insulating layer part is the insulating layer 30 which is arranged on the semiconductor substrate first main surface 21 and has the insulating layer main surface 31 that is the reverse surface of the surface in contact with the semiconductor substrate first main surface 21, and the insulating layer side surfaces 32. The element first main surface 11 is the insulating layer main surface 31, and the element second main surface 12 is the semiconductor substrate second main surface 22. The element side surface 13 is formed by the semiconductor substrate side surface 23 and the insulating layer side surface 32. The signal transmission/reception coil 15 includes the pair of coil forming conductors 15B formed inside the insulating layer 30, the pair of coil forming through conductors 15C which passes through the semiconductor substrate 20 and is connected to the pair of coil forming conductors 15B, and the coil forming bridge conductor 15D which is formed on the element second main surface 12 and forms a connection between the pair of coil forming through conductors.

Therefore, at the time of transmitting/receiving signals in a non-contact manner, it is not necessary to provide an interposer in the semiconductor element 10. Accordingly, the semiconductor element 10 can transmit/receive signals with a simple structure in a non-contact manner. Furthermore, since the signal transmission/reception coil 15 is formed by using a space in the semiconductor substrate 20 and the insulating layer 30, the signal transmission/reception coil 15 can be larger. Therefore, the signal transmission/reception coil 15 can generate a magnetic field of an advantageous magnitude for inductive coupling and can generate an induced current of an advantageous magnitude for inductive coupling.

The semiconductor element 10 is manufactured by a manufacturing method including a process of preparing the semiconductor substrate 20 having the semiconductor substrate first main surface 21, the semiconductor substrate second main surface 22, and the semiconductor substrate side surfaces 23 (FIG. 3A), an insulating layer laminating process which is an insulating layer laminating process of laminating the insulating layer 30 onto the semiconductor substrate first main surface 21 and includes a process of forming the pair of coil forming conductors 15B in the insulating layer 30 (FIG. 3B), a through-hole forming process of forming the coil forming through-hole 15C1 in the semiconductor substrate 20 and a part of the insulating layer 30 so that the pair of coil forming conductors 15B is exposed from the semiconductor substrate second main surface 22 (FIG. 3C), a through conductor forming process of forming the pair of coil forming through conductors 15C by disposing the conductive material 15C2 in the coil forming through-hole 15C1 (FIG. 3D), and a bridge conductor forming process of forming the coil forming bridge conductor 15D on the semiconductor substrate second main surface 22 so as to be connected to the pair of coil forming through conductors 15C (FIG. 3E).

Therefore, the semiconductor element 10 which can transmit/receive signals with a simple structure in a non-contact manner can be manufactured by a simple method.

Second Embodiment

Figure 4:
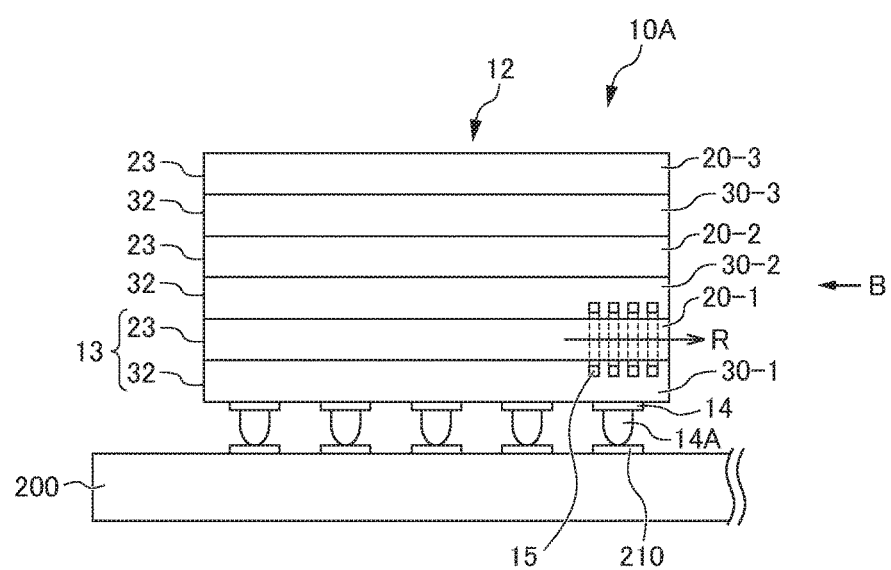
FIG. 4 is a sectional view of a semiconductor element according to a second embodiment.
Figure 5:
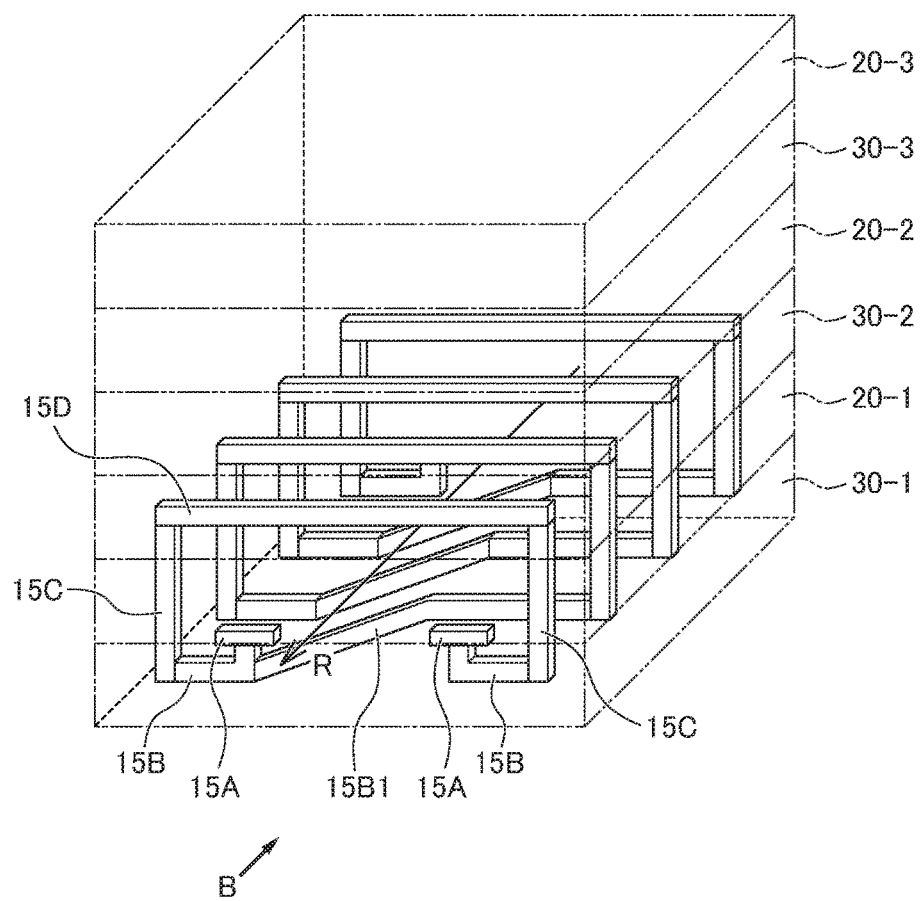
FIG. 5 is a perspective view of a signal transmission/reception coil viewed from an element side surface of the semiconductor element according to the second embodiment (viewed from direction B).

Next, a second embodiment is described with reference to FIGS. 4 and 5. FIG. 4 is a sectional view of a semiconductor element according to the second embodiment. FIG. 4 is a view corresponding to FIG. 1B. FIG. 5 is a perspective view of a signal transmission/reception coil viewed from an element side surface of the semiconductor element according to the second embodiment (viewed from direction B). Regarding the second embodiment, points different from the first embodiment are mainly described, and a description of the components similar to those of the first embodiment is omitted. The description regarding the first embodiment is appropriately applied to the points which are not especially described.

As illustrated in FIG. 4, a semiconductor element 10A according to the second embodiment includes a first semiconductor substrate 20-1, a second semiconductor substrate 20-2, and a third semiconductor substrate 20-3 which are plural semiconductor substrates as a semiconductor substrate part and a first insulating layer 30-1, a second insulating layer 30-2, and a third insulating layer 30-3 which are plural insulating layers as an insulating layer part. The first semiconductor substrate 20-1, the second semiconductor substrate 20-2, and the third semiconductor substrate 20-3 and the first insulating layer 30-1, the second insulating layer 30-2, and the third insulating layer 30-3 are alternately arranged. Each of the first semiconductor substrate 20-1, the second semiconductor substrate 20-2, and the third semiconductor substrate 20-3 includes a semiconductor substrate first main surface 21, a semiconductor substrate second main surface 22, and semiconductor substrate side surfaces 23. Each of the first insulating layer 30-1, the second insulating layer 30-2, and the third insulating layer 30-3 includes an insulating layer main surface 31 and insulating layer side surfaces 32. Each insulating layer is formed of a plurality of insulating films.

An element first main surface 11 is formed by the insulating layer main surface 31 of the first insulating layer 30-1 which is the closest to the element first main surface 11 of the three insulating layers, i.e., the first insulating layer 30-1, the second insulating layer 30-2, and the third insulating layer 30-3. The element second main surface 12 is formed by the semiconductor substrate second main surface 22 of the third semiconductor substrate 20-3 which is the closest to the element second main surface 12 of the three semiconductor substrates, i.e., the first semiconductor substrate 20-1, the second semiconductor substrate 20-2, and the third semiconductor substrate 20-3. The element side surface 13 is formed by the plurality of semiconductor substrate side surfaces 23 and the plurality of insulating layer side surfaces 32. The semiconductor substrate side surface 23 is connected to the insulating layer side surface 32 without a step.

The signal transmission/reception coil 15 is provided on the element side surface 13 formed by the plurality of semiconductor substrate side surfaces 23 (semiconductor substrate side surfaces of the first semiconductor substrate 20-1, the second semiconductor substrate 20-2, and the third semiconductor substrate 20-3) and the plurality of insulating layer side surfaces 32 (insulating layer side surfaces of the first insulating layer 30-1, the second insulating layer 30-2, and the third insulating layer 30-3). The six (plurality of) signal transmission/reception coils 15 are provided in line. The signal transmission/reception coil 15 includes a conductor that is formed inside the insulating layer 30 and a conductor that is formed inside the semiconductor substrate 20.

The signal transmission/reception coil 15 is a solenoid coil (cylindrical coil formed by winding conductive wire in a spiral shape) and can generate a magnetic field toward the element side surface 13 formed by the plurality of semiconductor substrate side surfaces 23 and the plurality of insulating layer side surfaces 32. The signal transmission/reception coil 15 can generate an induced current by receiving a magnetic field from the outside of the semiconductor element 10 toward the element side surface 13 formed by the plurality of semiconductor substrate side surfaces 23 and the plurality of insulating layer side surfaces 32. These magnetic fields are substantially perpendicular to the insulating layer side surfaces 32 and are substantially parallel to the element first main surface 11 and the element second main surface 12. A specific shape of the signal transmission/reception coil 15 is described below with reference to FIG. 5.

Similarly to the first embodiment, the signal transmission/reception coil 15 may or may not be exposed on the element side surface 13. The signal transmission/reception coil 15 and an external semiconductor element signal transmission/reception coil 120 can transmit/receive signals via the element side surface 13 in a non-contact manner by inductive coupling between both the coils.

As illustrated in FIG. 5, the signal transmission/reception coil 15 is a solenoid coil (cylindrical coil formed by winding conductive wire in a spiral shape). A helical axis R of the solenoid coil extends in a direction passing through the element side surfaces 13. The helical axis R of the solenoid coil is substantially perpendicular to the element side surfaces 13 and is substantially parallel to the element first main surface 11 and the element second main surface 12. The number of turns of the signal transmission/reception coil 15 is four (more than one).

The signal transmission/reception coil 15 includes four pairs of coil forming conductors 15B in the insulating layer 30, three coil forming conductor connecting conductors 15B1, four pairs of coil forming through conductors 15C, and four coil forming bridge conductors 15D. The four pairs of coil forming through conductors 15C are through electrodes (TSV) for passing through the first semiconductor substrate 20-1 (at least one semiconductor substrate) which is one of the plurality of semiconductor substrates 20 and is the closest to the element first main surface 11. The conductor of the four pairs of the coil forming through conductors 15C is, for example, copper, polysilicon, or tungsten. The four pairs of coil forming conductors 15B are conductors (for example, copper or aluminum) formed inside the first insulating layer 30-1 which is one of the plurality of insulating layers 30 arranged on the side of the semiconductor substrate first main surface 21 of the first semiconductor substrate 20-1. Each of the three coil forming conductor connecting conductors 15B1 forms a connection between the coil forming conductors 15B and is a conductor (for example, copper or aluminum) formed inside the first insulating layer 30-1. Each of the three coil forming conductor connecting conductors 15B1 has a bent part. The four coil forming bridge conductors 15D are conductors (for example, copper or aluminum) formed inside the second insulating layer 30-2 which is one of the plurality of insulating layers 30 arranged on the side of the semiconductor substrate second main surface 22 of the first semiconductor substrate 20-1.

The signal transmission/reception coil 15 can generate a magnetic field which is substantially perpendicular to the element side surfaces 13 and substantially parallel to the element first main surface 11 and the element second main surface 12. In addition, the signal transmission/reception coil 15 can generate an induced current by receiving a magnetic field which is substantially perpendicular to the element side surfaces 13 and substantially parallel to the element first main surface 11 and the element second main surface 12.

Next, a method of manufacturing the signal transmission/reception coil 15 of the semiconductor element 10A is described with reference to FIGS. 6A to 6E. FIGS. 6A to 6E are diagrams describing the method of manufacturing the signal transmission/reception coil of the semiconductor element according to the second embodiment of the present invention. As described above, the signal transmission/reception coil 15 is a solenoid coil of which the number of turns is four. However, for convenience of description regarding the manufacturing method, a first turn (for example, the part which is the closest to the element side surface 13) is illustrated in FIGS. 6A to 6E. The methods of manufacturing second and third turns are similar to that of the first turn, and the second to fourth turns are manufactured similarly to the first turn.

As illustrated in FIG. 6A, the first semiconductor substrate 20-1, the second semiconductor substrate 20-2, and the third semiconductor substrate 20-3 are prepared.

First, a pair of conductors on the semiconductor substrate 15A is formed on the semiconductor substrate first main surface of the first semiconductor substrate 20-1.

As illustrated in FIG. 6B, the first insulating layer 30-1 is formed on the semiconductor substrate first main surface 21 of the first semiconductor substrate 20-1. The second insulating layer 30-2 is formed on the semiconductor substrate first main surface 21 of the second semiconductor substrate 20-2. The third insulating layer 30-3 is formed on the semiconductor substrate first main surface 21 of the third semiconductor substrate 20-3.

In the process of forming the first insulating layer 30-1, the pair of coil forming conductors 15B is formed inside the first insulating layer 30-1. Although not shown, the coil forming conductor connecting conductor 15B1 is formed in addition to the above. A coil forming bridge conductor 15D is formed in the process of forming the second insulating layer 30-2. The coil forming bridge conductor 15D is formed as a floating conductor which is not connected to the other conductor. A conductor forming a coil is not formed inside the insulating layer 30-3.

As illustrated in FIG. 6C, the insulating layer main surface 31 of the second insulating layer 30-2 is bonded to the semiconductor substrate second main surface 22 of the first semiconductor substrate 20-1, and the insulating layer main surface 31 of the third insulating layer 30-3 is bonded to the semiconductor substrate second main surface 22 of the second semiconductor substrate 20-2. As a result, the first semiconductor substrate 20-1, the second semiconductor substrate 20-2, and the third semiconductor substrate 20-3 and the first insulating layer 30-1, the second insulating layer 30-2, and the third insulating layer 30-3 are alternately arranged. Fusion bonding is used as a bonding method.

As illustrated in FIG. 6D, the first insulating layer 30-1, the first semiconductor substrate 20-1, and a part of the second insulating layer 30-2 are selectively removed by etching or the like until the coil forming bridge conductor 15D is exposed from the insulating layer main surface 31 of the first insulating layer 30-1. As a result, a coil forming through-hole 15C1 is formed. The pair of coil forming conductors 15B is exposed in the coil forming through-hole 15C1.

Subsequently, a conductive material 15C2 is formed inside the coil forming through-hole 15C1 so that coil forming through conductors 15C are formed. More specifically, the forming method is as follows. The conductive material 15C2 is formed inside the coil forming through-hole 15C1 and on the insulating layer main surface of the first insulating layer 30-1 by electroplating or the like. The conductive material 15C2 outside the coil forming through-hole 15C1 is removed by chemical mechanical polishing (CMP) or the like. The conductive material 15C2 provided in the coil forming through-hole 15C1 and on an upper side of the coil forming conductor 15B is removed. As a result, as illustrated in FIG. 6E, the coil forming through conductors 15C connected to the respective coil forming conductors 15B and the coil forming bridge conductor 15D are formed.

The process illustrated in FIG. 6B is an insulating layer laminating process in which the insulating layers are laminated. The process illustrated in FIG. 6C is a process of alternately arranging the plurality of semiconductor substrates and the plurality of insulating layers. The process illustrated in FIG. 6D is a through-hole forming process. FIG. 6E illustrates a through conductor forming process.

The semiconductor element 10A according to the embodiment with the above structure provides the following effects. The semiconductor element 10A has the element first main surface 11, the element second main surface 12 which is a reverse surface of the element first main surface 11, and the element side surfaces 13. Furthermore, the semiconductor element 10A is configured from the semiconductor substrate part (the first semiconductor substrate 20-1 to the third semiconductor substrate 20-3) and the insulating layer part (the first insulating layer 30-1 to the third insulating layer 30-3). The semiconductor element 10A includes the signal transmission/reception terminal 14 which is provided on the element first main surface 11 and can transmit/receive signals to/from the external-substrate signal transmission/reception terminals 210 provided on the external substrate 200 that is external to the semiconductor element 10 in a contact manner and the signal transmission/reception coils 15 which are provided on the element side surface 13 and can transmit or receive signals to/from the external semiconductor element signal transmission/reception coils 120 provided on the external semiconductor element 100 that is external to the semiconductor element 10 via the element side surface 13 in a non-contact manner. The signal transmission/reception coil 15 includes the conductors (coil forming conductors 15B and coil forming bridge conductors 15D) formed inside the insulating layer 30 and the conductors formed inside the semiconductor substrate 20 (coil forming through conductor 15C).

The signal transmission/reception coil 15 is a solenoid coil, and the helical axis of the solenoid coil extends in the direction passing through the element side surface 13. The signal transmission/reception coil 15 includes, in the insulating layer 30, the pair of coil forming conductors which extends from the semiconductor substrate first main surface toward the insulating layer main surface and the coil forming bridge conductor which forms a connection between the pair of coil forming conductors. In the semiconductor element 10A, the semiconductor substrate part is the plurality of semiconductor substrates including the semiconductor substrate first main surface 21, the semiconductor substrate second main surface 22 that is the reverse surface of the semiconductor substrate first main surface 21, and the semiconductor substrate side surfaces 23 (the first semiconductor substrate 20-1 to the third semiconductor substrate 20-3). The insulating layer part is a plurality of insulating layers which is arranged on the plurality of semiconductor substrate first main surfaces 21 of the plurality of semiconductor substrates (the first semiconductor substrate 20-1 to the third semiconductor substrate 20-3) and has the insulating layer main surface 31 that is the reverse surface of the semiconductor substrate first main surface 21, and the insulating layer side surfaces 32 (the first insulating layer 30-1 to the third insulating layer 30-3). The plurality of semiconductor substrates (the first semiconductor substrate 20-1 to the third semiconductor substrate 20-3) and the plurality of insulating layers (the first insulating layer 30-1 to the third insulating layer 30-3) are alternately arranged. The element first main surface 11 is the insulating layer main surface 31 of the closest of the plurality of insulating layers to the element first main surface (first insulating layer 30-1), and the element second main surface 12 is the semiconductor substrate second main surface 22 of the closest of the plurality of semiconductor substrates to the element second main surface 12 (third semiconductor substrate 20-3). The element side surface 13 includes the semiconductor substrate side surfaces 23 of the plurality of semiconductor substrates and the insulating layer side surfaces 32 of the plurality of insulating layers. The signal transmission/reception coil 15 includes the pair of coil forming conductors 15B formed inside the insulating layer on the side of the first main surface which is one of the plurality of insulating layers (the first insulating layer 30-1), the coil forming bridge conductor 15D formed inside the insulating layer on the second main surface (the second insulating layer 30-2) which is one of the plurality of insulating layers and is arranged closer to the element second main surface 12 than the insulating layer on the first main surface (the first insulating layer 30-1), and the pair of coil forming through conductors 15C which forms a connection between the pair of the coil forming conductors 15B and the coil forming bridge conductor 15D.

Therefore, when transmitting/receiving signals in a non-contact manner, it is not necessary to provide an interposer in the semiconductor element 10A. Accordingly, the semiconductor element 10A can transmit/receive signals with a simple structure in a non-contact manner. Furthermore, since the signal transmission/reception coil 15 is formed by using a space in the semiconductor substrate 20 and the insulating layer 30, the signal transmission/reception coil 15 can be larger. Therefore, the signal transmission/reception coil 15 can generate a magnetic field having an advantageous magnitude for inductive coupling and can generate an induced current having an advantageous magnitude for inductive coupling.

The semiconductor element 10A is manufactured by a manufacturing method including an insulating layer laminating process of forming the pair of coil forming conductors 15B in the insulating layer on the first main surface (first insulating layer 30-1) (FIG. 3B) which is an insulating layer laminating process of forming the plurality of semiconductor substrates having the insulating layer provided thereon by respectively laminating the insulating layers (the first insulating layer 30-1 to the third insulating layer 30-3) on the plurality of semiconductor substrates (the first semiconductor substrate 20-1 to the third semiconductor substrate 20-3), a process of alternately arranging the plurality of semiconductor substrates and the plurality of insulating layers by bonding the plurality of semiconductor substrates to each other onto which the insulating layer has been laminated (FIG. 6C), a through-hole forming process, which is the through-hole forming process of forming the coil forming through-hole 15C1 in the element first main surface 11, of forming the coil forming through-hole 15C1 passing through the insulating layer on the first main surface (the first insulating layer 30-1), at least one semiconductor substrate (the first semiconductor substrate 20-1), and a part of the insulating layer on the second main surface (the second insulating layer 30-2) so that the coil forming bridge conductor 15D and the pair of coil forming conductors 15B are exposed (FIG. 6D), and a through conductor forming process of forming the pair of coil forming through conductors 15C to be connected to the coil forming bridge conductor 15D and the pair of coil forming conductors 15B by disposing the conductive material 15C2 in the coil forming through-hole 15C1 (FIG. 6E).

Therefore, the semiconductor element 10A which can transmit/receive signals with a simple structure in a non-contact manner can be manufactured by a simple method.

The first embodiment and the second embodiment according to the present invention have been described above. However, the present invention is not limited to the embodiments, and can be variously modified in the technical scope described in the claims.

In the first embodiment and the second embodiment, the inductive coupling between the coils has been used for the transmission/reception of the signal in a non-contact manner. However, the method of transmission/reception of the signal in a non-contact manner is not limited to this. Magnetic resonance between coils may be used for the transmission/reception of the signal in a non-contact manner.

The signal transmission/reception coil 15 is a solenoid coil of which the number of turns is four. However, the signal transmission/reception coil 15 is not limited to this. A ring-shaped coil of which the number of turns is one may be used. The winding direction of the solenoid coil may be either Z twist or S twist (or right handed and left handed).

In the first embodiment and the second embodiment, the signal transmission/reception coil 15 is not exposed from the element side surface 13. However, a part of the signal transmission/reception coil 15 may be exposed. As described above, if the signal transmission/reception coil 15 can transmit/receive signals via the element side surface 13 in a non-contact manner, it can be said that the signal transmission/reception coil 15 is provided on the element side surface 13 even when the signal transmission/reception coil 15 is not exposed from the element side surface 13 or a part of the signal transmission/reception coil 15 is exposed.

In the first embodiment and the second embodiment, the signal transmission/reception coils 15 are provided in a line. However, the signal transmission/reception coils 15 may be provided in more than two lines. In FIG. 1A, the signal transmission/reception coils 15 are provided on the single element side surface 13. However, the signal transmission/reception coils 15 may be provided on two or more element side surfaces 13. In addition, the size of the signal transmission/reception coil 15 is not limited to 7*10 μm$^2$, and may be appropriately adjusted. The interval between the signal transmission/reception coils 15 is not limited to 15 μm, and may be appropriately adjusted.

In the first embodiment and the second embodiment, when the coil forming conductors 15B are formed, the Damascene method is used. However, the forming method is not limited to this. For example, a process of forming a wire by sputtering and etching may be used. In addition, the coil forming conductor 15B is made of copper. In a case where the coil forming conductor 15B is manufactured by the process of forming the wire by sputtering and etching, the coil forming conductor 15B may be formed of aluminum or the like.

In the first embodiment, the semiconductor substrate part is the single semiconductor substrate 20, and the insulating layer part is the single insulating layer 30. However, the number is not limited to this. Similarly to the second embodiment, the semiconductor substrate part may include two or more semiconductor substrates 20, and the insulating layer part may include two or more insulating layers 30.

In this case, the coil forming bridge conductor 15D is provided in the semiconductor substrate second main surface 22 of the third semiconductor substrate 20-3 (semiconductor substrate closest to the element second main surface 12 of the plurality of semiconductor substrates). Unlike the second embodiment, the coil forming bridge conductor 15D is not provided in the second insulating layer 30-2. The coil forming through conductor 15C forms a connection between the pair of coil forming conductors 15B and provided in the first insulating layer 30-1 (one of the plurality of insulating layers) and the coil forming bridge conductor 15D.

Such a semiconductor element is manufactured by a manufacturing process including the insulating layer laminating process which is an insulating layer laminating process of forming the plurality of semiconductor substrates, on which the plurality of insulating layers is formed, by laminating the plurality of insulating layers (the first insulating layer 30-1 to the third insulating layer 30-3) onto the plurality of semiconductor substrates (the first semiconductor substrate 20-1 to the third semiconductor substrate 20-3) and includes the process of forming the pair of coil forming conductor 15B in the insulating layer on the first main surface (the first insulating layer 30-1), the process of alternately arranging the plurality of semiconductor substrates and the plurality of insulating layers by bonding the plurality of semiconductor substrates to each other onto which the insulating layer has been laminated, the through-hole forming process, which is a through-hole forming process of forming the coil forming through-hole 15C1 in the element second main surface 12, of forming the coil forming through-hole 15C1 so that the pair of coil forming conductors 15B is exposed, the through conductor forming process of forming the pair of coil forming through conductors 15C by disposing the conductive material 15C2 in the coil forming through-hole 15C1, and the process of forming the coil forming bridge conductor 15D which forms a connection between the pair of coil forming through conductors 15C on the semiconductor substrate second main surface 22.

In the second embodiment, the three semiconductor substrates are provided in the semiconductor substrate part, and the three insulating layers are provided in the insulating layer part. However, the numbers of the semiconductor substrates and insulating layers are not limited to these. Two semiconductor substrates and two insulating layers may be provided, and four or more semiconductor substrates and four or more insulating layers may be provided.

In the second embodiment, the coil forming through conductor 15C is provided in the first semiconductor substrate 20-1. However, the position of the coil forming through conductor 15C is not limited to this. The coil forming through conductor 15C may be provided in the second semiconductor substrate 20-2. In addition, the coil forming through conductor 15C is provided in the only single semiconductor substrate (the first semiconductor substrate 20-1). However, the position of the coil forming through conductor 15C is not limited to this. The coil forming through conductor 15C may be provided so as to pass through two or more semiconductor substrates. That is, it is preferable that the coil forming through conductor 15C be provided in at least one semiconductor substrate.

In the second embodiment, fusion bonding is used as the bonding method. However, the bonding method is not limited to this. For example, the boding method may be a method by using adhesive and a method of surface activated room temperature bonding.

In the first embodiment and the second embodiment, the semiconductor substrate 20 is made of silicon. However, the material of the semiconductor substrate 20 is not limited to this. The semiconductor substrate 20 may be formed of a semiconductor material other than silicon (for example, compound semiconductor such as GaAs).

In the first embodiment and the second embodiment, the insulating layer 30 is made of silicon oxide. However, the material of the insulating layer 30 is not limited to this. The insulating layer 30 may be made of an insulating material other than silicon oxide (for example, silicon nitride), and the insulating layer 30 may be a laminate of two or more kinds of insulating materials.

The semiconductor element 10 and the external semiconductor element 100 are not limited to a semiconductor element having a specific signal processing function and may be a semiconductor element having a signal processing function such as a logic IC, a CPU, a memory, a DSP, and a FPGA. The external semiconductor element 100 and the semiconductor element 10 may have different signal processing functions and may have the same signal functions. It is possible for the semiconductor element 10 to be capable of transmitting/receiving signals to/from two or more external semiconductor elements 100 in a non-contact manner.

EXPLANATION OF REFERENCE NUMERALS 1 semiconductor device
10, 10A semiconductor element 11 element first main surface
12 element second main surface
13 element side surface
44
14 signal transmission/reception terminal
14A conductive member
15 signal transmission/reception coil (signal transmission/reception unit)
15A conductor on semiconductor substrate
15B a pair of coil forming conductors
15B1 coil forming conductor connecting conductor
15C coil forming through conductor
15C1 coil forming through-hole
15C2 conductive material
15D coil forming bridge conductor
20 semiconductor substrate (semiconductor substrate part)
20-1 first semiconductor substrate (semiconductor substrate part)
20-2 second semiconductor substrate (semiconductor substrate part)
20-3 third semiconductor substrate (semiconductor substrate part)
21 semiconductor substrate first main surface
22 semiconductor substrate second main surface
23 semiconductor substrate side surface
30 insulating layer (insulating layer part)
30-1 first insulating layer (insulating layer part and insulating layer on the first main surface)
30-2 second insulating layer (insulating layer part and insulating layer on the second main surface)
30-3 third insulating layer (insulating layer part)
31 insulating layer main surface
32 insulating layer side surface
100 external semiconductor element
110 external semiconductor element signal transmission/reception terminal
120 external semiconductor element signal transmission/reception coil (external semiconductor element signal transmission/reception unit)
200 external substrate
210 External-substrate signal transmission/reception terminal
R helical axis

The invention claimed is:

1. A semiconductor element which has an element first main surface, an element second main surface which is a reverse surface of the element first main surface, and element side surfaces and is configured from a semiconductor substrate part and an insulating layer part, the semiconductor element comprising:
a signal transmission/reception terminal configured to be provided on the element first main surface and transmit/receive signals to/from an external-substrate signal transmission/reception terminal provided on an external substrate that is external to the semiconductor element in a contact manner; and
a signal transmission/reception coil configured to be provided on the element side surface and transmit/receive signals to/from an external semiconductor element signal transmission/reception unit which is provided to an external semiconductor element that is external to the semiconductor element via the element side surface in a non-contact manner, wherein
the signal transmission/reception coil includes a conductor that is formed inside the insulating layer part and a conductor that is formed inside the semiconductor substrate part,
the semiconductor substrate part is a semiconductor substrate having a semiconductor substrate first main surface, a semiconductor substrate second main surface which is a reverse surface of the semiconductor substrate first main surface, and semiconductor substrate side surfaces,
the insulating layer part is an insulating layer which is arranged on the semiconductor substrate first main surface and has an insulating layer main surface which is a reverse surface of a surface in contact with the semiconductor substrate first main surface, and insulating layer side surfaces,
the element first main surface is the insulating layer main surface, the element second main surface is the semiconductor substrate second main surface, and the element side surface is formed by the semiconductor substrate side surface and the insulating layer side surface, and
the signal transmission/reception coil includes a pair of coil forming conductors formed inside the insulating layer, a pair of coil forming through conductors passing through the semiconductor substrate and connected to the pair of coil forming conductors, and a coil forming bridge conductor which is formed on the element second main surface and forms a connection between the pair of coil forming through conductors.

2. The semiconductor element according to claim 1, wherein
the signal transmission/reception coil is a solenoid coil, and a helical axis of the solenoid coil extends in a direction passing through the element side surfaces.

3. A method of manufacturing the semiconductor element according to claim 1, comprising:
a process of preparing the semiconductor substrate having the semiconductor substrate first main surface, the semiconductor substrate second main surface, and the semiconductor substrate side surfaces;
an insulating layer laminating process of laminating the insulating layer onto the semiconductor substrate first main surface and including a process of forming the pair of coil forming conductors in the insulating layer;
a through-hole forming process of forming a through-hole in the semiconductor substrate and a part of the insulating layer so that the pair of coil forming conductors is exposed from the semiconductor substrate second main surface;
a through conductor forming process of forming the pair of coil forming through conductors by disposing a conductive material in the through-hole; and
a bridge conductor forming process of forming the coil forming bridge conductor on the semiconductor substrate second main surface so as to connect the pair of coil forming through conductors.

4. A semiconductor element which has an element first main surface, an element second main surface which is a reverse surface of the element first main surface, and element side surfaces and is configured from a semiconductor substrate part and an insulating layer part, the semiconductor element comprising:
a signal transmission/reception terminal configured to be provided on the element first main surface and transmit/receive signals to/from an external-substrate signal transmission/reception terminal provided on an external substrate that is external to the semiconductor element in a contact manner; and
a signal transmission/reception coil configured to be provided on the element side surface and transmit/receive signals to/from an external semiconductor element signal transmission/reception unit which is provided to an external semiconductor element that is external to the semiconductor element via the element side surface in a non-contact manner, wherein the signal transmission/reception coil includes a conductor that is formed inside the insulating layer part and a conductor that is formed inside the semiconductor substrate part, the semiconductor substrate part is a plurality of semiconductor substrates including a semiconductor substrate first main surface, a semiconductor substrate second main surface which is a reverse surface of the semiconductor substrate first main surface, and semiconductor substrate side surfaces, the insulating layer part is a plurality of insulating layers each of which is arranged on the semiconductor substrate first main surface of each of the plurality of semiconductor substrates and has an insulating layer main surface which is a reverse surface of the semiconductor substrate first main surface, and insulating layer side surfaces, the plurality of semiconductor substrates and the plurality of insulating layers are alternately arranged, the element first main surface is the insulating layer main surface of the closest of the plurality of insulating layers to the element first main surface, the element second main surface is the semiconductor substrate second main surface of the closest of the plurality of semiconductor substrates to the element second main surface, and each of the element side surfaces is formed by the semiconductor substrate side surfaces of the plurality of semiconductor substrates and the insulating layer side surfaces of the plurality of insulating layers, and the signal transmission/reception coil includes a pair of coil forming conductors formed inside an insulating layer on the first main surface which is one of the plurality of insulating layers, a coil forming bridge conductor formed inside an insulating layer on the second main surface which is one of the plurality of insulating layers and is arranged closer to the element second main surface than the insulating layer on the first main surface, and a pair of coil forming through conductors which forms a connection between the pair of coil forming conductors and the coil forming bridge conductor.

5. A method of manufacturing the semiconductor element according to claim 4, comprising:

an insulating layer laminating process of forming the plurality of semiconductor substrates, on which the insulating layer is formed, by laminating the insulating layer onto each of the plurality of semiconductor substrates and including a process of forming the pair of coil forming conductors in the insulating layer on the first main surface and a process of forming the coil forming bridge conductor, which is not connected to the other conductor, in the insulating layer on the second main surface;

a process of alternately arranging the plurality of semiconductor substrates and the plurality of insulating layers by bonding the plurality of semiconductor substrates onto which the insulating layer has been laminated;

a through-hole forming process of forming a through-hole from the element first main surface and forming the through-hole so that the coil forming bridge conductor and the pair of coil forming conductors are exposed; and a through conductor forming process of forming the pair of coil forming through conductors which is connected to the coil faulting bridge conductor and the pair of coil forming conductors by disposing a conductive material in the through-hole.

6. The semiconductor element according to claim 4, wherein the signal transmission/reception coil is a solenoid coil, and a helical axis of the solenoid coil extends in a direction passing through the element side surfaces.

7. A semiconductor element which has an element first main surface, an element second main surface which is a reverse surface of the element first main surface, and element side surfaces and is configured from a semiconductor substrate part and an insulating layer part, the semiconductor element comprising:

a signal transmission/reception terminal configured to be provided on the element first main surface and transmit/receive signals to/from an external-substrate signal transmission/reception terminal provided on an external substrate that is external to the semiconductor element in a contact manner; and a signal transmission/reception coil configured to be provided on the element side surface and transmit/receive signals to/from an external semiconductor element signal transmission/reception unit which is provided to an external semiconductor element that is external to the semiconductor element via the element side surface in a non-contact manner, wherein the signal transmission/reception coil includes a conductor that is formed inside the insulating layer part and a conductor that is formed inside the semiconductor substrate part, the semiconductor substrate part is a plurality of semiconductor substrates including a semiconductor substrate first main surface, a semiconductor substrate second main surface which is a reverse surface of the semiconductor substrate first main surface, and semiconductor substrate side surfaces, the insulating layer part is a plurality of insulating layers each of which is arranged on the semiconductor substrate first main surface of each of the plurality of semiconductor substrates and has an insulating layer main surface which is a reverse surface of the semiconductor substrate first main surface, and insulating layer side surfaces, the plurality of semiconductor substrates and the plurality of insulating layers are alternately arranged, the element first main surface is the insulating layer main surface of the closest of the plurality of insulating layers to the element first main surface, the element second main surface is the semiconductor substrate second main surface of the closest of the plurality of semiconductor substrates to the element second main surface, and each of the element side surfaces is formed by the semiconductor substrate side surfaces of the plurality of semiconductor substrates and the insulating layer side surfaces of the plurality of insulating layers, and the signal transmission/reception coil includes a pair of coil forming conductors formed inside one of the plurality of insulating layers, a coil forming bridge conductor arranged on the element second main surface, and a pair of coil forming through conductors which forms a connection between the pair of coil forming conductors and the coil forming bridge conductor.

8. A method of manufacturing the semiconductor element according to claim 7, comprising:
- an insulating layer laminating process of forming the plurality of semiconductor substrates, on which the insulating layer is formed, by laminating the insulating layer on each of the plurality of semiconductor substrates and including a process of forming the pair of coil forming conductor in one of the insulating layers;
- a process of alternately arranging the plurality of semiconductor substrates and the plurality of insulating layers by bonding the plurality of semiconductor substrates onto which the insulating layer has been laminated;
- a through-hole forming process of forming a through-hole from the element second main surface and forming the through-hole so that the pair of coil forming conductors is exposed;
- a through conductor forming process of forming the pair of coil forming through conductors by disposing a conductive material in the through-hole; and
- a process of forming the coil forming bridge conductor, for connecting the pair of coil forming through conductors, on the semiconductor substrate second main surface.

9. The semiconductor element according to claim 7, wherein
the signal transmission/reception coil is a solenoid coil, and a helical axis of the solenoid coil extends in a direction passing through the element side surfaces.

\* \* \* \* \*